United States Patent [19]

Thomann

[11] Patent Number: 5,149,964
[45] Date of Patent: Sep. 22, 1992

[54] MICROWAVE INTERACTION MODULE, IN PARTICULAR FOR AN ATOMIC OR MOLECULAR BEAM RESONATOR

[75] Inventor: Pierre Thomann, Fontainemelon, Switzerland

[73] Assignee: Oscilloquartz S.A., Neuchatel, Switzerland

[21] Appl. No.: 616,534

[22] Filed: Nov. 21, 1990

[30] Foreign Application Priority Data

Nov. 24, 1989 [SZ] Swaziland ............... 04213/89-6

[51] Int. Cl.$^5$ .................................. H01S 1/00
[52] U.S. Cl. ........................................ 250/251
[58] Field of Search ............... 250/251; 331/3

[56] References Cited

U.S. PATENT DOCUMENTS 3,345,581 10/1967 Vessot ........................ 250/251
3,670,171 6/1972 Lacey et al. ................ 250/251
3,967,115 6/1976 Kern ........................... 250/251

FOREIGN PATENT DOCUMENTS 1433742 4/1965 France .

Primary Examiner—Bruce C. Anderson
Attorney, Agent, or Firm—Weil, Gotshal & Manges

[57] ABSTRACT

A module is described having a magnetic shielding enclosure composed of a pedestal and of a housing unit. The housing unit has an electromagnetic cavity to create a radiofrequency field and a plurality of electrical conductors arranged to form a solenoid. The beam of particles passes through the shielding enclosure through two apertures provided in the entry and exit plates. The electrical conductors are arranged in a symmetrical manner in relation to a plane parallel to the plane of the coils and containing the beam of particles. A very homogenous, constant magnetic field results. The module can be used in atomic or molecular beam resonators.

9 Claims, 5 Drawing Sheets

MICROWAVE INTERACTION MODULE, IN PARTICULAR FOR AN ATOMIC OR MOLECULAR BEAM RESONATOR

FIELD OF THE INVENTION

The present invention relates to a microwave interaction module. Such modules are in particular used in atomic beam or molecular beam resonators.

DESCRIPTION OF THE PRIOR ART

Atomic beam resonators are described in DE-AS-1,260,049, U.S. Pat. No. 3,670,171 and CH-599,712. These resonators operate with cesium, thallium or rubidium atoms or with ammonia molecules The principle of an atomic or molecular beam resonator consists of detecting a resonance in a hyperfine state of the atom or molecule in order to obtain a standard frequency. For this purpose, the particles are emitted in vapour form from a source and then concentrated into a narrow beam by a collimator. This beam of particles passes through a first state selecting magnet, commonly referred to as the A magnet, which selects the particles having a certain first energy state These particles are directed to a microwave interaction module in which they are subjected firstly to a constant magnetic field, commonly referred to as the C-field, and secondly to a control magnetic field. When the frequency of this control magnetic field is equal to a resonance frequency of the particles, the latter undergo a transition from the first energy state to a second certain energy state The beam of particles emerging from the microwave interaction module then passes through a second state selector, commonly referred to as the B magnet, which selects the particles having the second energy state to direct them to a detector. The number of particles detected is used for producing a control signal of the frequency of an oscillator which emits, to the microwave interaction module, an electrical signal generating the control magnetic field In this manner an oscillator is obtained, the frequency of which is controlled by the resonance frequency of the particles It is clear that the better the frequency of the resonance line is defined, the more accurate is the standard frequency.

The homogeneity of the C-field is thus important because it has a direct influence on the energy states of the particles, that is, ultimately on the frequency of the atomic resonance.

U.S. Pat. No 3,670,171 describes a structure which makes it possible to obtain a substantially homogenous C-field FIG. 1 shows a longitudinal section of the microwave module described in this patent and FIGS. 2 and 3 respectively show sections along lines II—II and III—III of FIG. 1

This microwave module 2 essentially comprises a magnetic shielding enclosure 4, of parallelepipedic form, in which are arranged an electromagnetic cavity 6 and conductive coils 8. The particles beam passes through the enclosure through two apertures 10 and 12 and is subjected during its path 14 to the interrogating field (radiofrequency field) created by the electromagnetic cavity 6.

A shield 16 comprising a plate 18 of permeable magnetic material on which the conductive coils 20 are wound makes it possible to attenuate the inhomogeneities in the C-field caused by the passage aperture 22 of the base of the electromagnetic cavity through the enclosure 4.

Passages also have to be provided in the enclosure 4 to connect the coils 8 and 20 to an external electrical source. These passages induce inhomogeneities in the C-field. This problem is totally evaded in the cited patent because the coils 8 and 20 are shown diagrammatically, without any connection to an external electrical source.

Swiss patent 599,712 describes a solenoid structure designed to be placed in a magnetic shielding enclosure.

This solenoid 23, shown in FIG. 4, is composed of a printed circuit 24 on which is embodied a plurality of parallel electrical conductors 26.

Electrical insulation is provided around the printed circuit by two polyimide bands 28 and 30 each arranged on one side of the printed circuit.

The solenoid 23 is wound about itself to form a rectangular loop. It will be noted that the loop comprises two terminal parts each formed by a section 32, 34 perpendicular to the beam of particles (these pass through the solenoid through the apertures 36 and 38) and by a section 40, 42 parallel to the plane of the loop. A space 44 is thus provided to receive the base of the electromagnetic cavity.

The magnetic shielding enclosure contains only the rectangular loop, the sections 32, 34, 40 and 42 being on the outside.

The C-field produced by this solenoid is not perfectly homogenous. A first problem is caused by the wafers 46 and 48 which comprise electrical conductive elements designed to ensure the continuity of the coils which are normally interrupted by the apertures 36 and 38. These elements increase the density of the current and thus cause inhomogeneities near the beam of particles. A second, more serious, problem is caused by the sections 32 and 34 since the electrical current which, in these parts is parallel to the nominal direction of the C-field, initiates a C-field component parallel to the plane of the coils, which is undesirable. The electrical connection between the loop designed to create the C-field and an electrical source which is external to the magnetic shielding enclosure thus presents numerous distortions which greatly limit the homogeneity of the C-field.

OBJECTS OF THE INVENTION

It is an object of the invention to substantially improve the homogeneity of the C-field. This aim is achieved by a special arrangement of the electrical conductors forming the solenoid.

BRIEF SUMMARY OF THE INVENTION

According to the present invention therefore there is provided a microwave interaction module for causing atomic or molecular particles to interact with a radiofrequency magnetic field comprising:

a magnetic shielding enclosure formed of a cylindrical part having a rectangular base closed at its extremities by an entry plate and an exit plate, each of these having an aperture therein for the passage of a beam of particles through the shielding enclosure along an axis parallel to the axis of the cylinder, a source of constant magnetic C-field comprising a plurality of coils arranged inside the enclosure designed to be connected to an electrical source outside the enclosure, and a radiofrequency field source to create a radiofrequency electromagnetic field along the path of the particles It is an important feature of this module that each coil is formed of one or several electrical conductors, the two extremities of each electrical conductor passing through said enclosure and the extremities of the conductors being connected to each other and adapted to be connected to an electrical source to form parallel coils subjected to the same current, said electrical conductors being arranged in symmetrical manner in relation to a plane parallel to the plane of the coils and containing the beam of particles.

It will be understood that very good homogeneity of the C-field is obtained since each section of electrical conductor capable of creating an interfering magnetic field is associated by symmetry to a section of the electrical conductor which creates an opposing magnetic field. The compensation is perfect in the plane of symmetry Electrical conductors can be formed of flat ribbon conductors or of wires It is notably possible to use a single flat ribbon having substantially the width of the magnetic shielding enclosure (this width is the dimension along an axis parallel to the C-field)

The passage apertures of the conductors through the enclosure are advantageously slits parallel to the C-field This embodiment favours good homogeneity of the C-field because no magnetic flux can pass through these passage apertures

BRIEF DESCRIPTION OF THE DRAWINGS

The characteristic features and advantages of the invention are better illustrated by the following description given for purposes of example, but which is not limiting, and with reference to the accompanying drawings in which FIGS. 1 to 3, already described, show various sections of a microwave interaction module of the prior art, FIG. 4, already described shows another microwave interaction module of the prior art.

DETAILED DESCRIPTION OF THE INVENTION

Figures 1, 2:
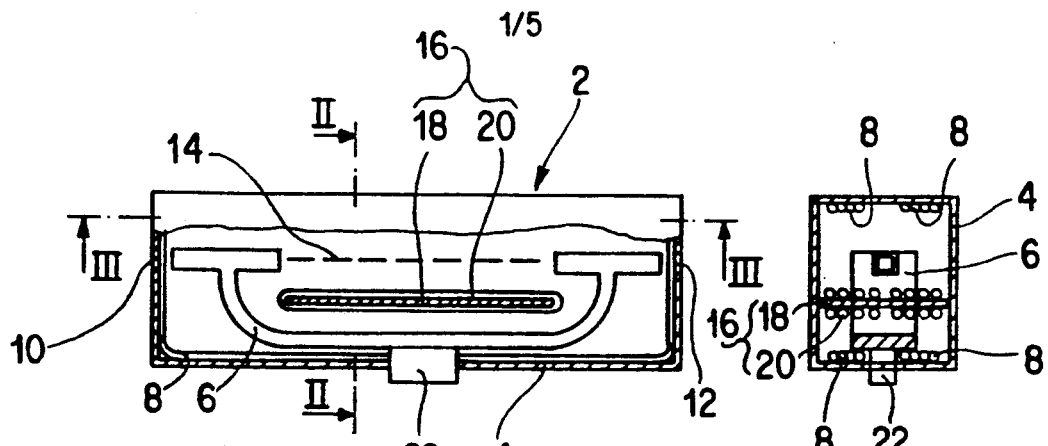
Figure 3:
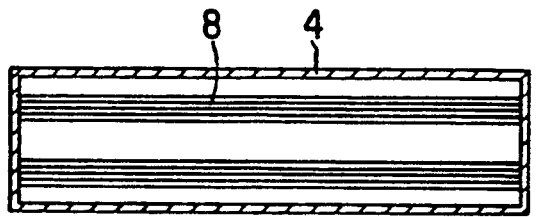
Figure 4:
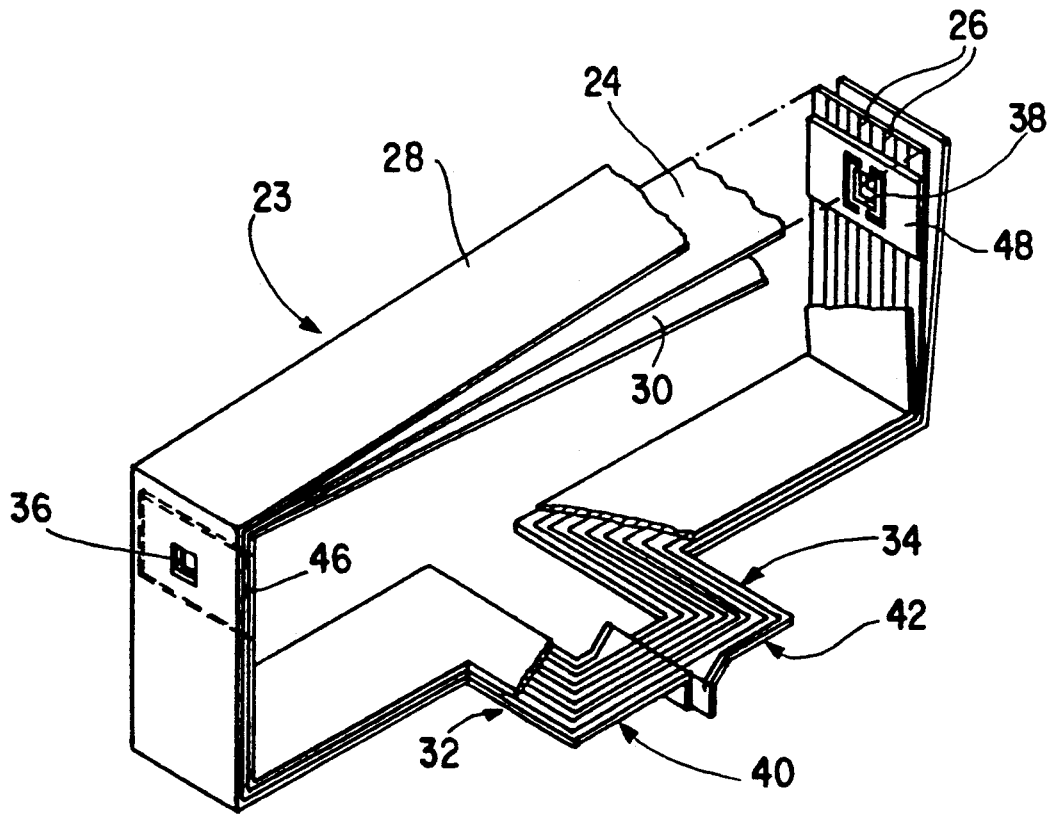
Figure 5:
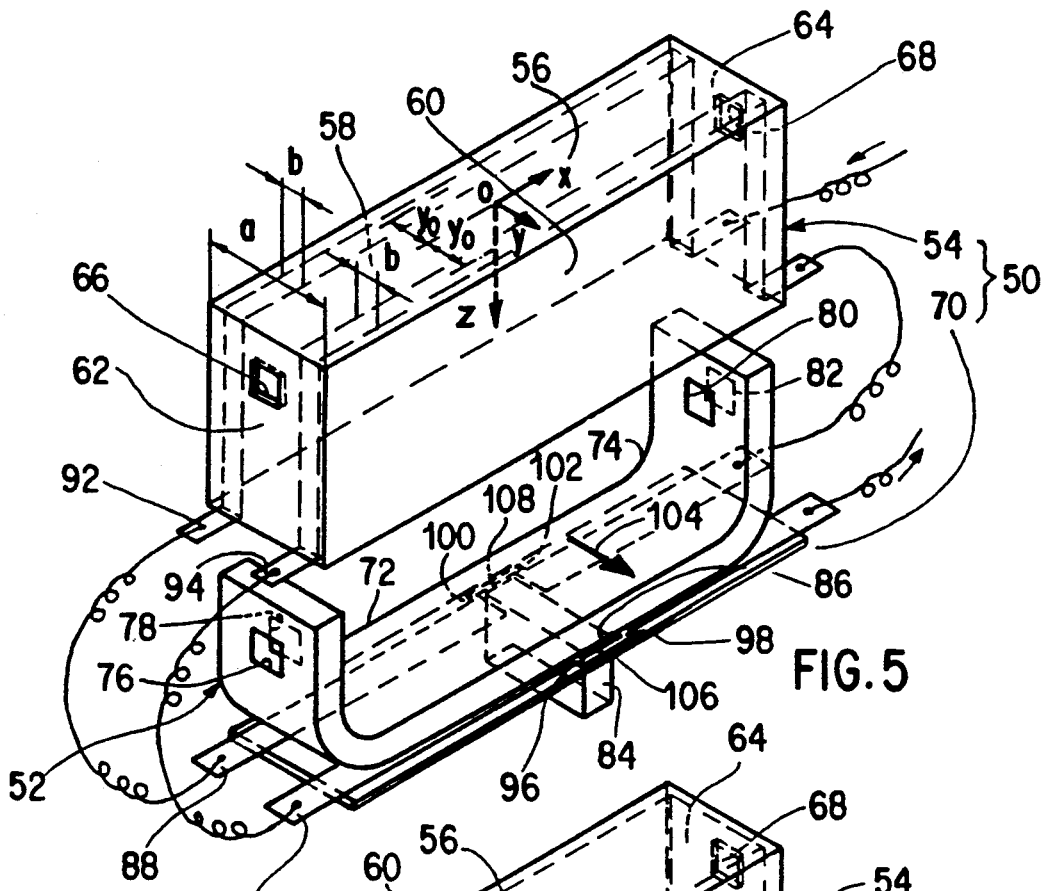
FIGS. 5 to 8 show various embodiments of the microwave interaction module of the invention.

FIG. 5 is a perspective view of a first embodiment of a microwave interaction module of the invention.

This module comprises a magnetic shielding enclosure 50 in which is arranged an electromagnetic cavity 52. The enclosure 50 is parallelepipedic; it comprises a housing element 54 having an upper plate 56, two side plates 58, 60, an entry plate 62 and an exit plate 64. The entry and exit plates are each provided with an aperture 66, 68 for the passage of a beam of particles. The housing element 54 is designed to be welded onto a pedestal 70 to form a closed enclosure.

The electromagnetic cavity 52 is conventional It comprises two arms 72, 74 the extremities of which are pierced by apertures 76, 78, 80, 82 aligned on the axis of the beam of particles and a base 84 passing through an aperture 86 of the pedestal 70.

Finally, the microwave interaction module comprises a plurality of electrical conductors arranged on the inside faces of the plates 56, 62, 64 and of the pedestal 70. In accordance with the invention, these conductors are arranged in symmetrical manner in relation to a plane PS parallel to the plane of the coils and containing the axis of the beam of particles. In other words, this plane of symmetry PS is parallel to the side plates 58, 60 and bisects the plates 56, 62, 64 and the pedestal 70 through their centre The microwave interaction module of FIG. 5 comprises four electrical conductors 88, 90, 92, 94 formed of electrically insulated flat ribbons The conductors 88 and 90 are mounted on or fixed to the pedestal 70; they comprise, in the vicinity of the aperture 86, sections 96, 98, 100, 102 parallel to the direction of the C-field, shown by an arrow 104, and sections 106, 108 connecting the sections 96, 98 and 100, 102 respectively.

When the two conductors 88, 90 are traversed by an electrical current of the same direction, it will be found that the sections 96 and 100, which are symmetrical in relation to the plane PS, are traversed by currents that are parallel and in opposite directions. The contributions of these sections which, taken separately, impair the homogeneity of the C-field, compensate each other totally in the plane of symmetry. The same applies to the sections 98 and 102, the contributions of which to C-field compensate each other. Finally, the sections 106 and 108, which are parallel to the conductors 88 and 90, are traversed by currents of the same direction.

The sections 96, 98, 100, 102 can be omitted if the width of the conductors 88 and 90 is increased towards the edges of the pedestal 70. The conductors 88 and 90 then have the same width along their entire length except adjacent to the aperture 86 where they are reduced to the sections 106 and 108.

The conductors 92 and 94 are not impeded by any obstacle; they therefore have the same width throughout and do not comprise any section that is not perpendicular to the C-field These conductors are mounted on or fixed to the inside faces of the plates 56, 62 and 64.

The two ends of the conductors 88, 90, 92 and 94 appear at the outside of the enclosure 50. These extremities are connected as shown diagrammatically to form a winding having two coils in series.

The passage apertures of the conductors through the enclosure 50 are thus limited to two slits situated respectively on the ridge defined by the entry plate 62 and the pedestal 70 and on the ridge defined by the exit plate 64 and the pedestal 70. Each slit is symmetrical in relation to the plane PS. Moreover, these slits being parallel to the C-field, the disturbance on the magnetic induction lines that is necessarily caused by these passage apertures is minimized so that the homogeneity of the C-field remains virtually unaffected.

In the embodiment shown, the winding is formed of two flat ribbon coils. It is of course possible to provide a larger number of conductors and it is possible to vary the width thereof or to replace them by thin wires.

The number, width and relative position of the conductors cannot be chosen independently if one wishes to obtain a homogenous C-field. The relationships to be observed are known and given, notably in U.S. Pat. No. 3,670,171, already mentioned, in the case of conductors forming two wide ribbons.

These relationships do not apply in the case of conductors formed of thin wires, such as those described in CH-599 712, already mentioned.

The magnetic field produced by two coils of width b (in the case of a ribbon-shaped conductor) or of diameter b (in the case of a wire-shaped conductor) can be established using the Biot-Savart formula and the magnetic shielding properties, by using the principle of image currents. The component $B_y$ along the axis Oy perpendicular to the plane of the coils is equal to $$B_y(z) = \frac{2 \cdot \mu_0 \cdot i}{\pi \cdot b} \cdot \sum_{k=-\infty}^{+\infty} \text{Arctg} \frac{\frac{b}{a} \cdot \frac{z}{a}}{\left(\frac{z}{a}\right)^2 + \left(\frac{y_0}{a} + k\right)^2 - \left(\frac{b}{2a}\right)^2}$$

in the plane of symmetry PS (y=0) where
$\mu_0$ is the vacuum magnetic permeability
i is the coil current
b is the width of the coil (thin, coated against the shielding)
a is the width of the shielding
$Y_o$ is the distance between the plane of symmetry PS and the centre of the conductors
Similar relationships may be established for any number of coils.

Figure 6:
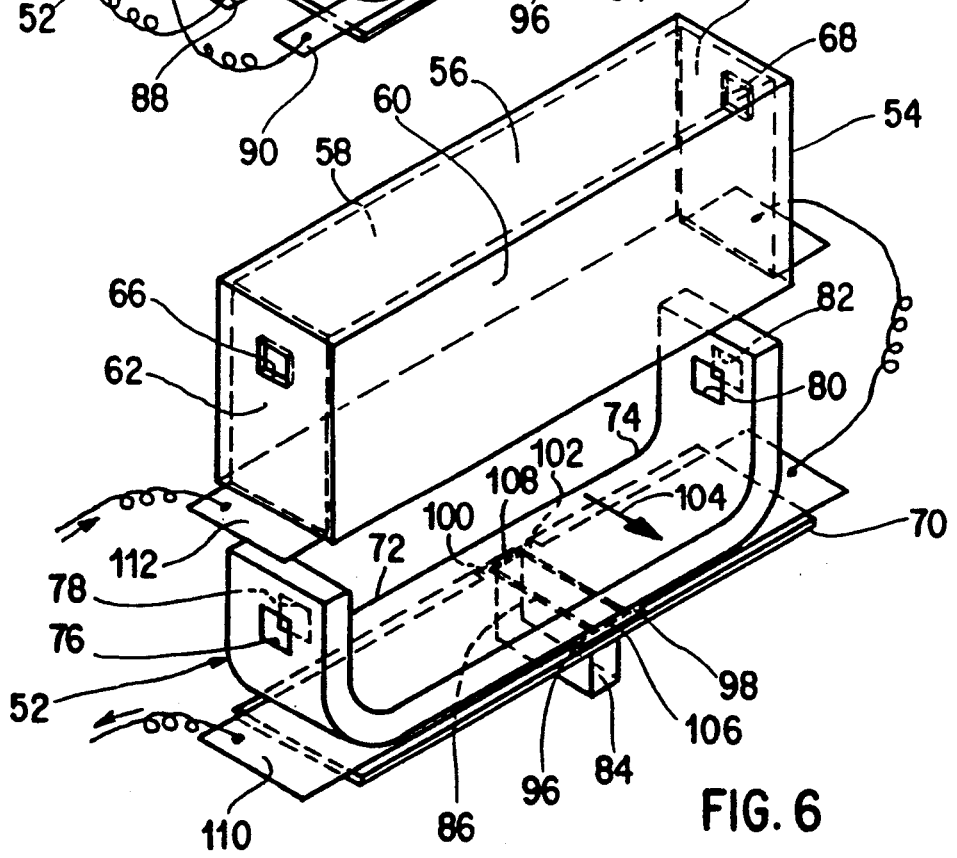

An embodiment showing a single wide coil is shown in FIG. 6. This coil is formed of two conductors 110 and 112, the first being mounted on or fixed to the pedestal 70 and the second on the inside faces of the plates 56, 62 and 64.

The conductor 110 has an aperture aligned with the aperture 86 and sections 96-106 which symmetrically surround this aperture. The conductor 112 also includes apertures aligned with the apertures 66 and 68 of the entry and exit plates The ends of the conductors are connected outside the enclosure 50 to form a conductive coil.

This embodiment makes it possible to approach the ideal winding of a magnetic shielding of parallelepipedic form without any aperture.

As in the embodiment in FIG. 5, the passage slits of the extremities of the conductors across the enclosure are parallel to the direction of the C-field so that these slits do not damage the homogeneity of the C-field.

Figure 7:
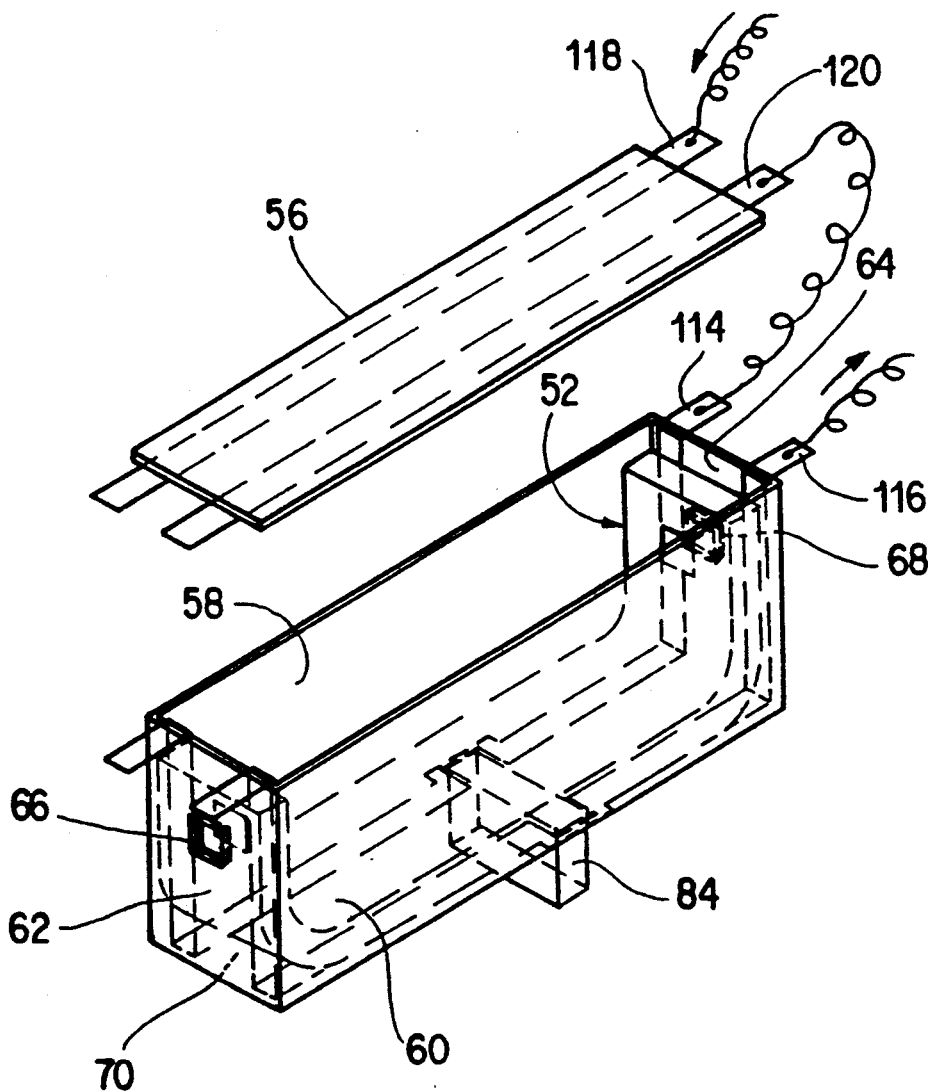

FIG. 7 shows another embodiment of the microwave interaction module of FIG. 5.

In this figure, the side plates 58, 60 and the entry and exit plates 62, 64 are welded to the pedestal 70 and conductors 114, 116 are mounted on or fixed to the inside faces of the plates 62, 64 and of the pedestal 70. After positioning the electromagnetic cavity 52, the upper plate 56 provided on the inside face of two conductors 118, 120 is welded to the other plates to close the enclosure.

In this embodiment the passage slits of the conductors are located on the ridges defined by the upper plate 56 and the entry and exit plates 62, 64.

It should be noted that the passage slits are closer to the beam of particles than in the case of FIG. 5; the disturbances caused by these slits on the particles are thus more sensitive in the case of the module of FIG. 7.

In each embodiment described hereinabove, the passage slits of the conductors are parallel to the direction of the C-field. The advantages of such an arrangement have already been mentioned. It should be noted that the same advantages are obtained if the passage slits are located at the centre of a plate instead of being on a ridge, provided they are oriented parallel to the C-field.

It should, however, be admitted that in general this makes construction of the module more complicated.

Although it would seem that the best result should be obtained with passage slits disposed parallel to the direction of the C-field, it would also be possible to provide passage slits perpendicular to the direction of the C-field, provided these slits are symmetrical in relation to the plane of symmetry PS, so that the disturbances which they cause at least partially compensate each other. This arrangement remains of interest, 05 notably in the case of wire-shaped conductors since the slits are then reduced to holes of small diameter.

Figure 8:
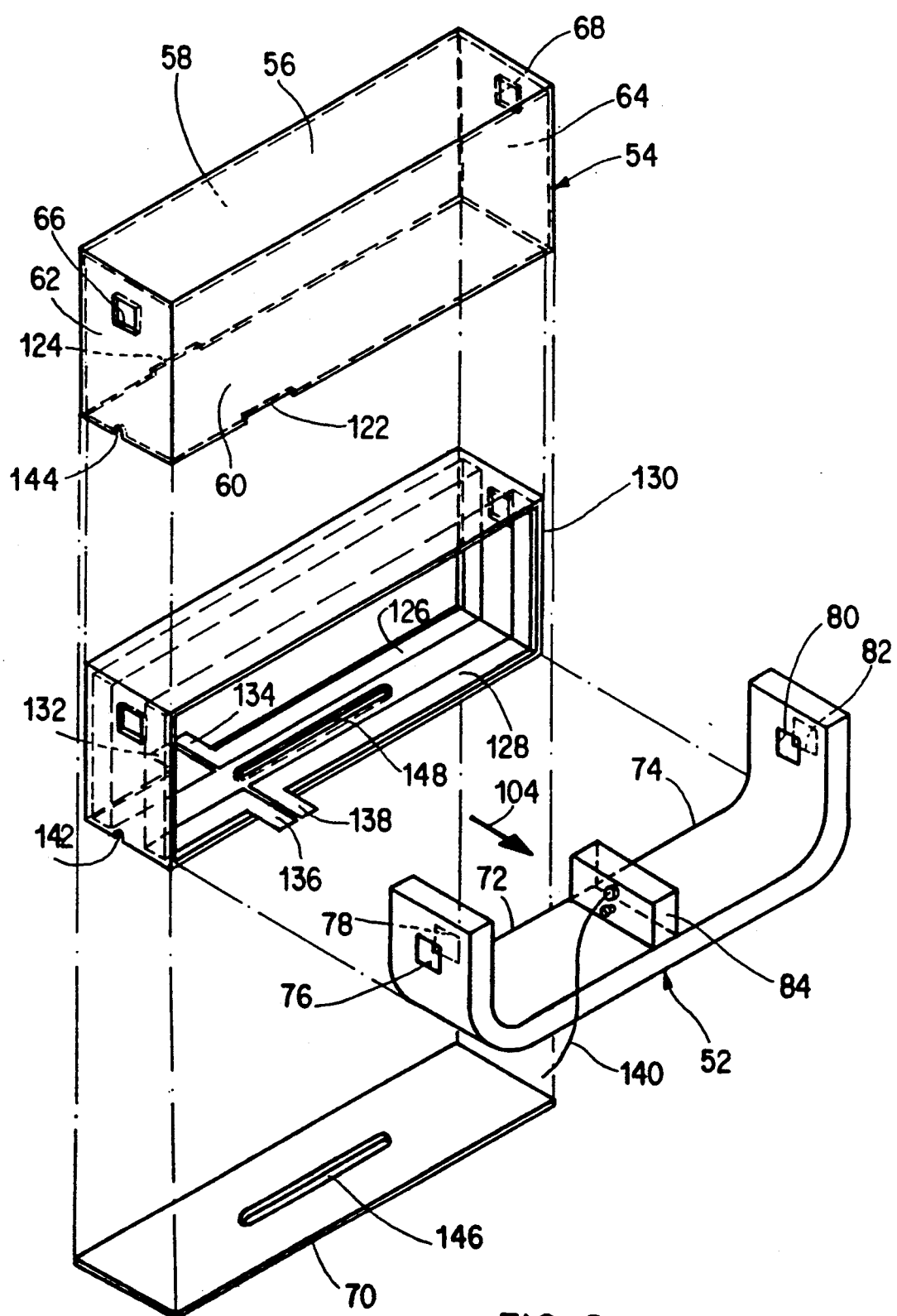

Thus, in the microwave module shown in FIG. 8, the passage slits 122, 124 are perpendicular to the direction of the C-field. They are arranged on the ridges formed by the pedestal 70 with the side walls 58, 60.

The electrical conductors 126, 128 are mounted on or fixed to the inside face of a rectangular support 130. They each comprise two sections 132, 134 and 136, 138 parallel to the C-field.

The sections 132 and 136 are symmetrical with respect to the plane PS; they are traversed by opposing currents in such a way that the disturbances caused by these sections compensate one another. The same applies in the case of the sections 134 and 138.

The electromagnetic cavity 52 shown in this figure is of special design It has been described by the applicant in U.S. patent application Ser. No. 07-489,810 filed on Mar. 16, 1990 and entitled "Microwave interaction module, notably for an atomic or molecular beam resonator", the contents of which are incorporated herein by reference.

The base 84 of this electromagnetic cavity is located on the upper part of the arms 72, 74. It is therefore possible to eliminate the passage aperture 86 (FIG. 5) of the pedestal 70, thereby reducing the inhomogeneities of the C-field and improving the magnetic shielding factor. This electromagnetic cavity is fed by a coaxial cable 140 which passes through the support 130 and the enclosure 54 through two small apertures 142 and 144.

An elongated projection 146 is provided on the pedestal 70 to serve as fixation to the electromagnetic cavity 52. An aperture 148 aligned with the projection 146 is clearly provided in the support 130. It is, of course, possible to provide several parallel projections which open into corresponding apertures provided on either side of the conductors 126, 128.

Figure 9:
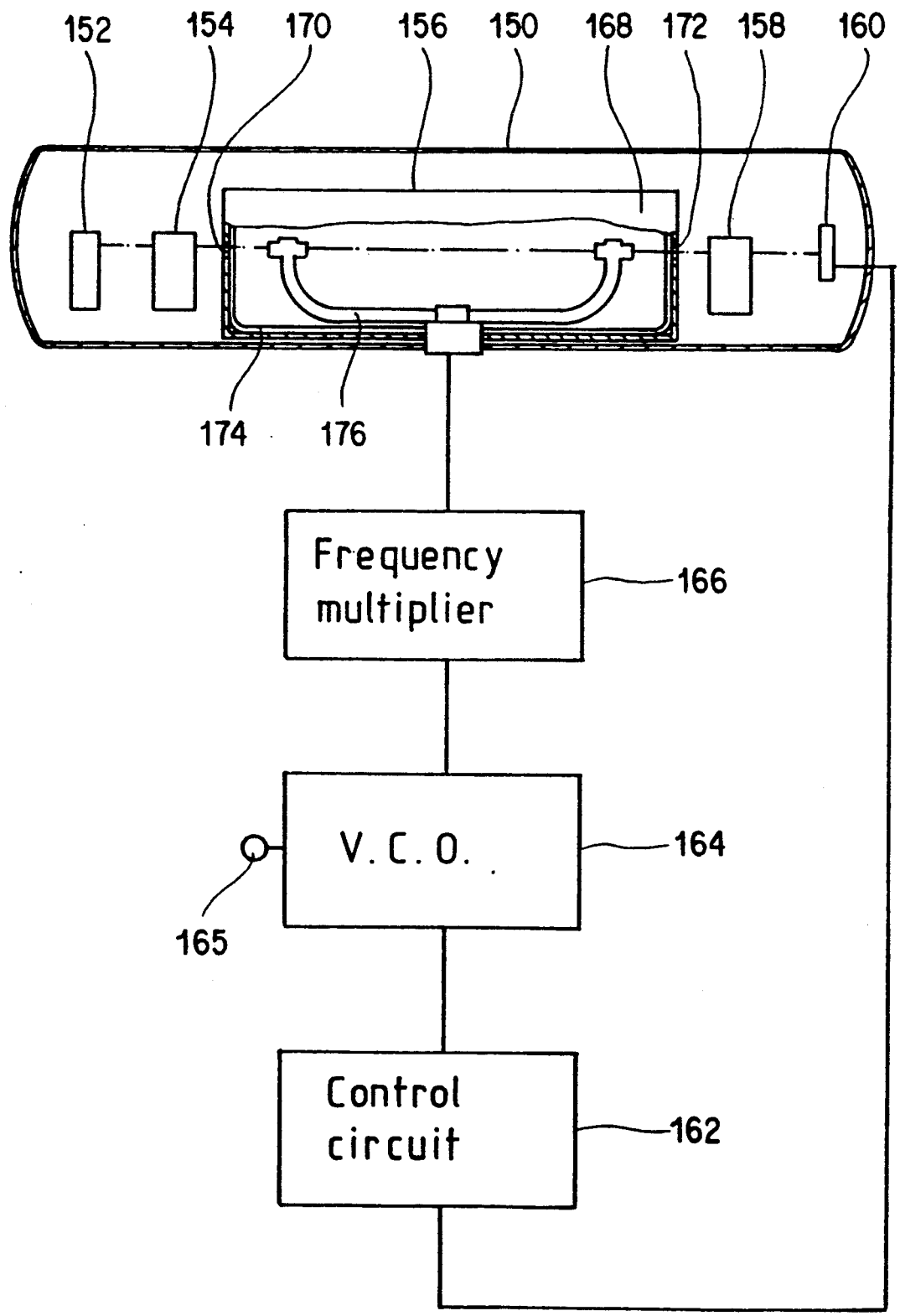
FIG. 9 shows diagrammatically a beam particle resonator comprising a microwave interaction module of the invention.

The microwave interaction module of the invention as described constitutes an element of a particle beam resonator, one embodiment of which is shown in longitudinal section in FIG. 9.

This resonator comprises, in a vacuum enclosure 150, a source 152 of particles (atomic or molecular), a first state selector 154, a microwave interaction module 156, a second state selector 158 and a detector 160. It also comprises outside the enclosure 150 a servo circuit consisting of a control circuit 162 for controlling the frequency of an oscillator 164 as a function of a signal delivered by the detector 160, and a frequency multiplier 166 to convert the frequency of the signal delivered by the oscillator to the frequency necessary for inducing a transition in the energy state of the particles.

The source 162 comprises an oven for producing the particles in vapour form and a collimator to form a beam of particles having the form of a narrow beam The first state selector, commonly referred to as the A magnet, produces an intense non-homogenous magnetic field perpendicular to the particle beam. It permits only the particles occupying the first determined energy state to be directed to the microwave interaction module 156.

This module comprises a magnetic shielding enclosure 168 having two apertures 170, 172 to permit the entry and exit of the particle beam, a plurality of coils 174 through which an electrical current passes in order to form a static magnetic field, referred to as the C-field, generally perpendicular to the axis of the bundle of particles, and an electromagnetic cavity 176, referred to as a Ramsey cavity, in which a control magnetic field prevails of frequency close to the atomic transition frequency of the particles from the first energy state into a second energy state.

On leaving the microwave interaction module 156, the particles are subjected to a magnetic field generated by a second state selector, similar to the first and referred to as the B magnet, the function of which is to deflect the particles so that only the particles that have undergone a transition of energy state are directed to the detector 160.

When the frequency of the signal delivered by the frequency multiplier 166 is equal to the transition frequency between the two energy states of the particles, the number of particles received by the detector 160 is great. Conversely, if the frequency of the signal delivered by the frequency multiplier 166 does not correspond to the transition frequency, the particles do not undergo a transition of energy state and the detector 160 does not receive any particles. The number of particles received by the detector 160 is thus used by the control circuit 162 to control the frequency of the oscillator 164 and consequently the frequency of the control magnetic field. The frequency of the oscillator is generally 5 to 10 MHz. This signal is available on a port 165.

In the case of the particles being cesium atoms, the transition between the energy states (F=4, mF=0) and (F=3, mF=0) is generally used. The frequency of the corresponding control signal is close to 9.192631770 GHz.

The microwave interaction module of the invention may also be used in a resonator with optical pumping. This resonator is of similar structure to that shown in FIG. 9, the only difference being that the state selectors 154 and 158 are replaced by optical pumping lasers which induce a transition of the particles from the second state to the first energy state via a more energetic state. Thus, if the frequency of the interrogation signal is correct, the particles undergo a transition from the first energy state to the second energy state in the microwave interaction module, then an inverse transition by the laser, replacing the state selector 158. This inverse transition causes light to be emitted Conversely, if the frequency of the interrogation signal does not correspond to the transition of energy state, the particles remain in the first energy state and no light emission results Consequently, the measurement of the intensity of this light emission enables the oscillator to be controlled.

I claim:

1. A microwave interaction module for reacting atomic or molecular particles with a radiofrequency magnetic field comprising:
    a magnetic shielding enclosure formed of a cylindrical part having a rectangular base closed at its extremities by an entry plate and an exit plate, said plates each having an aperture for the passage of a beam of particles through the shielding enclosure along an axis parallel to the axis of the cylinder,
    a constant magnetic field source comprising a plurality of parallel coils arranged inside the enclosure and designed to be connected to an electrical source outside the enclosure, and
    an electromagnetic cavity to create a radiofrequency electromagnetic field along the path of the particles,
    wherein each coil is formed of one or several electrical conductors, the two extremities of each electrical conductor passing through said enclosure and the extremities of the conductors being connected to each other and being designed to be connected to the electrical source to form parallel coils traversed by the same current, said electrical connectors being arranged in symmetrical manner in relation to a plane (PS) parallel to the plane of the coils and containing the bundle of particles.

2. A module according to claim 1 wherein the apertures for the passage of the electrical conductors through the enclosure are also arranged in symmetrical manner in relation to said plane (PS).

3. A module according to claim 1 which comprises a single coil having a width substantially equal to the width of the entry and exit plates.

4. A module according to claim 1 which comprises an even number of coils.

5. A module according to claim 1 in which the enclosure comprises at least one slit for the passage of the extremities of the electrical conductors, each slit being parallel to the direction of the constant magnetic field.

6. A module according to claim 5 in which at least one slit is situated on one edge of the entry plate or of the exit plate.

7. A module according to claim 6 wherein the enclosure comprises a pedestal and a housing element welded to one another, the extremities of the electrical conductors passing through slits located on two opposite edges of the pedestal.

8. A module according to claim 1 wherein electrical conductors comprise sections parallel to the direction of the constant magnetic field, the plurality of said sections being arranged symmetrically to said plane (PS).

9. A module according to claim 8 in which said sections pass through the enclosure wherein said enclosure comprises two slits parallel to the plane of the coils and arranged symmetrically to said plane (PS).

* * * * *